United States Patent [19]
Yamauchi et al.

[11] Patent Number: 5,469,402
[45] Date of Patent: Nov. 21, 1995

[54] BUFFER CIRCUIT OF A SEMICONDUCTOR MEMORY DEVICE

[75] Inventors: Tadaaki Yamauchi; Kei Hamade; Yoshikazu Morooka, all of Hyogo, Japan

[73] Assignee: Mitsubishi Denki Kabushiki Kaisha, Tokyo, Japan

[21] Appl. No.: 305,632

[22] Filed: Sep. 14, 1994

[30] Foreign Application Priority Data

Sep. 16, 1993 [JP] Japan .................................. 5-230154
Jul. 25, 1994 [JP] Japan .................................. 6-172432

[51] Int. Cl.$^6$ .................................................. G11C 11/413
[52] U.S. Cl. .......................... 365/230.08; 365/189.05
[58] Field of Search ................ 365/230.08, 189.05, 365/203

[56] References Cited

FOREIGN PATENT DOCUMENTS 3-214669  9/1991  Japan .

Primary Examiner—Joseph A. Popek
Attorney, Agent, or Firm—Lowe, Price, LeBlanc & Becker

[57] ABSTRACT

An internal address signal is outputted quickly by connecting nMOS transistors in series to inverters forming a latching circuit of a row address buffer circuit, applying an external row address signal to the gate of a nMOS transistor, applying a delayed activation signal φ2 to the gate of the nMOS transistors, grounding the gate of the nMOS transistor, triggering nMOS transistors into complete conduction by the delayed activation signal φ2 to reduce the ON resistance. A column address buffer circuit receives a ZCAS circuit by an NOR gate, and an external column address signal by an NAND gate during standby, to prevent a flow of a through current.

7 Claims, 8 Drawing Sheets

BUFFER CIRCUIT OF A SEMICONDUCTOR MEMORY DEVICE

BACKGROUND OF THE INVENTION

1. Field of the Invention

The present invention relates to semiconductor memory devices, and more particularly, to a semiconductor memory device such as a DRAM with a built-in buffer circuit receiving an external signal.

2. Description of the Background Art

FIG. 6 is a block diagram showing an entire structure of a conventional DRAM. Referring to FIG. 6, a clock signal generation circuit 101 responds to externally applied ZRAS and ZCAS signals of a TTL level to generate a clock signal of a CMOS level. An externally applied ZWE signal of a TTL level and a clock signal from clock signal generation circuit 101 are applied to a gate circuit 102. In response, gate circuit 102 provides a control signal to an input buffer 103 and an output buffer 104. An address buffer circuit 110 includes a row address buffer circuit that provides a row address signal INX of a CMOS level and a column address buffer circuit that provides a column address signal INY of a CMOS level according to externally applied address signals $A_0, A_1, \ldots A_n$ of a TTL level. A row address signal is applied to a row decoder 105, and a column address signal is applied to a column decoder 106 after being latched in a latching circuit 111. Row decoder 105 decodes a row address signal to specify a row address of memory cell array 109. Column decoder 106 decodes a column address signal to specify a column address of memory cell array 109.

Input buffer 103 receives data of a TTL level. An input/output control circuit 108 writes data applied via input buffer 103 into an addressed memory cell, or reads out data from an addressed memory cell. The read out data is outputted via an output buffer 104 from a driver 107. Output buffer 104 is activated by an externally applied ZOE signal of a TTL level. Here, in a TTL level, the potential is 0.8 V at a L level, and 2.0 V at a H level. In a CMOS level, the potential is 0 V at a L level and power supply potential of Vcc at a H level.

FIG. 7 is a circuit diagram showing an example of a row address buffer circuit of FIG. 7.

Referring to FIG. 7, a power supply reset signal generation circuit 1 is included in a clock signal generation circuit 101 of FIG. 6. Power supply reset signal generation circuit 1 generates a power-on reset (ZPOR) signal in response to the power turned on. More specifically, power supply reset signal generation circuit 1 includes a resistor R2 and a capacitor C3 connected between power supply Vcc and ground, and CMOS inverters 4 and 5 connected to the node thereof. The ZPOR signal of a CMOS level provided from power supply reset signal generation circuit 1 is inverted by CMOS inverter 6 to be applied to one input terminal of a CMOS NOR gate 51. NOR gate 51 has a ZRAS signal applied to the other input terminal, and prevents a ZRAS signal from being fetched inside until the power is turned on. NOR gate 51 responds to a ZPOR signal of a L level to provide a ZRAS signal. The output of NOR gate 51 is delayed by inverters 8 and 9 to be output as an activation signal ϕ1. Activation signal ϕ1 is applied to a row address buffer circuit 20 and to a delay circuit 10. Delay circuit 10 includes CMOS inverters 11 and 14, a pMOS capacitor 12, and an nMOS capacitor 13. Delay circuit 10 delays activation signal ϕ1 for a predetermined time. This delayed output is inverted by a CMOS inverter 15 to be provided to row address buffer circuit 20 as a delayed activation signal ϕ2 of a CMOS level.

Row address buffer circuit 20 forms a latching circuit having the inputs and outputs of two inverters 20a and 20b connected alternately. One inverter 20a includes pMOS transistors 21 and 22, and nMOS transistors 23, 24, 25 and 26. The other inverter 20b includes pMOS transistors 27 and 28, and nMOS transistors 29, 30, 31 and 32. Power supply +V is applied to the sources of pMOS transistors 21 and 22 of one inverter 20a. Activation signal ϕ1 is applied to respective gates of pMOS transistor 21 and nMOS transistor 23. PMOS transistors 21 and 22 have their drains connected to the drain of nMOS transistor 23 via a node A. A ZINX1 signal is outputted from node A. NMOS transistor 23 has its source connected to the drains of nMOS transistors 24 and 26. A delayed activation signal ϕ2 is applied to the gate of the nMOS transistor 24. NMOS transistor 24 has its source connected to the drain of nMOS transistor 25 via a node N, and an external row address signal 1 is applied to the gate thereof. NMOS transistors 25 and 26 have their sources grounded. PMOS transistor 22 and nMOS transistor 26 have their gates connected to the output of the other inverter 20b.

PMOS transistors 27 and 28 of the other inverter 20b have their sources connected to power supply +V. Activation signal ϕ1 is applied to the gates of pMOS transistor 28 and nMOS transistor 29. PMOS transistors 27 and 28 have their drains connected to the drain of nMOS transistor 29 via a node B. A INX1 signal is output from node B. NMOS transistor 29 has its source connected to respective drains of nMOS transistors 30 and 32. NMOS transistor 30 has its source connected to the drain of A nMOS transistor 31. A delayed activation signal ϕ2 is applied to the gate of NMOS transistor 30. nMOS transistor 31 has its gate grounded, and nMOS transistors 31 and 32 have their sources grounded. A plurality of row address buffer circuits 20 are provided corresponding to address signals $A_0, A_1, \ldots, A_n$.

FIG. 8 is a timing chart for describing the operation of FIG. 7.

The operation of row address buffer circuit 20 of FIG. 7 will be described with reference to FIG. 8. When the power is turned on as shown in FIG. 8(a), the output ZPOR signal of power supply reset signal generation circuit 1 is rendered to a H level from a L level as shown in (b). When the power supply potential becomes Vcc from 0 V at time t0, the input of inverter 4 via resistor R2 attains a H level to be outputted via inverters 4 and 5, whereby ZPOR signal attains a H level. When ZPOR signal attains a H level, this signal of a H level is inverted by inverter 6 to cause one input terminal of NOR gate 51 gate 51 to attain a L level. In response to the voltage level of a ZRAS signal shown in (c), NOR gate 51 generates a signal. When ZRAS signal attains a L level from a H level at time t1, activation signal ϕ1 attains a H level as shown in (d). At time t2 determined by delay circuit 10, delayed activation signal ϕ2 attains a L level as shown in (e).

When an external row address signal 1 of a H level is applied during the time period of time t3–t4 as shown in (f), the row address buffer circuit 20 provides an INX1 signal of a L level and a ZINX1 signal of a H level as shown in (g), whereby the internal row address attains a H level.

The operation of row address buffer circuit 20 will be described in detail hereinafter. An external row address signal 1 of a TTL level is applied to the gate of nMOS transistor 25 of one inverter 20a. Since the H level is 2 V and the L level is 0.8 V in a TTL level, the threshold potential which is the boundary of a L level and a H level of a TTL level is 1.4 V. The threshold voltage is adjusted by differentiating the size of nMOS transistors 26 and 32 so that ZINX1 signal attains a L level and INX1 signal attains a H level when external row address signal 1 is greater than 1.4 V. When activation signal φ1 attains a L level, node A of inverter 20a and node B of inverter 20b are both precharged to the level of power supply potential vcc. Activation signal φ1 attains a H level, and one of INX1 signal and ZINX1 signal, which are the outputs of the latch formed by inverters 20a and 20b, is determinated at a L level according to the signal intensity of the external row address signal 1.

Referring to FIG. 8(f), the voltage of external row address signal 1 from time t3 to t4 is 2.0 V which is a H level of TTL, indicating the case where a H address is inputted. Assuming that internal power supply potential Vcc is 3.3 V, activation signal φ1 attains a L level of 0 V until time t1', and nodes A and B are precharged to 3.3 V via pMOS transistors 21 and 28. When activation signal φ1 rises from 0 V to 3.3 V, pMOS transistors 21 and 28 are turned off. Since delayed activation signal φ2 attains a H level of 3.3 V, nMOS transistors 24 and 30 are turned on, whereby nMOS transistors 25 and 31 connected in series to nMOS transistors 24 and 30 conduct. The positive charge in node A is discharged so that the potential of node A approximates 0. As a result, the conductance of pMOS transistor 27 increases to turn on pMOS transistor 27, and the conductance of nMOS transistor 32 is reduced to turn off nMOS transistor 32. Thus, node B becomes 3.3 V. INX1 signal which is an output of inverter 20b is applied to inverter 20a, whereby a positive feedback is applied. ZINX1 signal becomes 0 V, and the latch output is determinated so that INX1 signal becomes 3.3 V.

The time required for the output of the latch to be ascertained depends upon the time required for drawing out the positive charge that is precharged in node A. The current flowing to nMOS transistors 24 and 25 is I when node A is discharged via nMOS transistors 23–25. The ON resistance between the source and drain of nMOS transistor 25 receiving an external row address signal 1 of 2 V at its gate is R1, and the on resistance is R0 when the source potential is 0 V and the gate voltage is 3.3 V. When the gate voltage of the nMOS transistor is reduced, the ON resistance between the source and drain is increased, so that the following equation (1) is established.

$$R1 > 0 \quad (1)$$

Therefore, the potential of node N which is the source potential of nMOS transistor 24 is raised by IxR1. When the substrate potential of the nMOS transistor is 0 V, a back-bias of −IxR1 is applied across nMOS transistor 24, whereby the threshold value of nMOS transistor 24 rises due to a body effect. Although activation signal φ2 of 3.3 V is applied to the gate of nMOS transistor 24, source-drain ON resistance R2 becomes greater than R0 as shown in the following equation (2).

$$R2 > R0 \quad (2)$$

By a body effect due to the potential rise of node N, the ON resistance between the source and drain of nMOS transistor 24 is increased. As a result, the discharging speed of node A is reduced to delay an output of an internal row address.

FIG. 9 is a circuit diagram showing a conventional column address buffer circuit. Referring to FIG. 9, an externally applied ZCAS signal of a TTL level is inverted by an inverter 41 to be applied to one input terminal of a CMOS NAND gate 42. A ZPOR signal is applied from a power supply reset signal generation circuit 1 to the other input terminal of NAND gate 42. NAND gate 42 functions to prevent output of a ZCAS signal until the power supply rises. The output of NAND gate 42 is inverted by a CMOS inverter 43 to be applied to one input terminal of a CMOS NAND gate 44 as an activation signal φ3. An external column address signal 1 of a TTL level is applied to the other input terminal of NAND 44. NAND gate 44 responds to activation signal φ3 to output an external column address signal 1. The output thereof is inverted by an inverter 45 to be provides as an internal column signal. A plurality of column address buffer circuits are provided corresponding to address signals $A_1, A_2, \ldots A_n$.

FIG. 10 is a timing chart for describing an operation of the column address buffer of FIG. 9. When the power supply voltage is powered on from 0 V to Vcc at time t0 as shown in (a), a ZPOR signal outputted from power supply reset signal generation circuit 1 is pulled up to a H level from a L level, as shown in (b), to be applied to NAND gate 42. Because ZCAS signal attains a H level of 2 V at a TTL level in a standby state, NAND gate 42 takes the logical product of an inversion signal of inverter 41 and a ZPOR signal, and does not accept an external input prior to the power being turned on. More specifically, because ZPOR signal attains a L level until power is turned on, NAND gate 42 does not accept a ZCAS signal.

After the power is turned on, when ZCAS signal is pulled down to a L level from a H level at time t1, activation signal φ3 attains a H level as shown in (d), whereby NAND gate 44 accepts an input external column address signal 1. FIG. 10(e) shows the case where external column address signal 1 attains a H level. When activation signal φ3 is pulled up to a H level, the address buffer output INY1 attains a H level as shown in (f). Here, the first stage of the column address buffer circuit of FIG. 9 is formed by an inverter 41. In the conventional column address buffer circuit shown in FIG. 9, a through current will be conducted in inverter 41 when ZCAS signal attains an intermediate potential between 0 V and power supply voltage Vcc even before the power is turned on.

As described above, a conventional row address buffer circuit is a latching type having the inputs and outputs of two inverters 20a and 20b connected to each other as shown in FIG. 7. There was the problem that the time for a latched output to be ascertained is delayed.

Furthermore, because the column address buffer circuit of FIG. 9 has the buffer means receiving a ZCAS signal of a H level formed by inverter 41 and NAND gate 42, there is a possibility of a through current flowing in inverter 41 even when the power is not yet turned on.

In recent semiconductor memory devices, the memory capacity is increased from 16M bits to a greater level such as 64M bits and 256M bits. In response, there is a greater number of address signals, resulting in increase of the address pins. Furthermore, the number of data input buffers is increased due to multi-bit data. It is necessary to increase the integration density according to increase in the memory capacity.

There are cases when a CMOS NOR gate or a CMOS NAND gate is used as a buffer. Comparing a NOR gate with an NAND gate having the same driving capability, an NAND gate is smaller in size. Although the usage of a NOR gate and a NAND gate has respective merits and demerits, a NAND gate is preferably used in order to improve the integration density.

SUMMARY OF THE INVENTION

In view of the foregoing, a main object of the present invention is to provide a semiconductor memory device including a row address buffer signal that can have body effect reduced to increase the speed and a column address buffer circuit that can suppress a through current prior to the power supply being turned on and that can have the circuit complexity reduced.

According to an aspect of the present invention, first and second nodes for providing an output signal is precharged by first and second precharge circuits, wherein first and second transistors are disconnected from first and second precharge circuits when a first activation signal attains a first logic level, and the first and second precharge circuits are connected to the first and second transistors when the first activation signal attains a second logic level, whereby, the time required for ascertaining the potential of the first and second nodes starting from the application of an external control signal can be reduced by providing a signal from the first and second nodes according to a control signal applied to the first transistor.

According to another aspect of the present invention, a CMOS inclusive OR gate receives an external control signal and an activation signal for activating a buffer circuit, and a CMOS logical product gate receives data and an output of the inclusive OR gate during standby, whereby data is output from the logical product gate when the output of the inclusive OR gate attains a first logic level. This prevents the flow of a through current due to data prior to the power being turned on.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
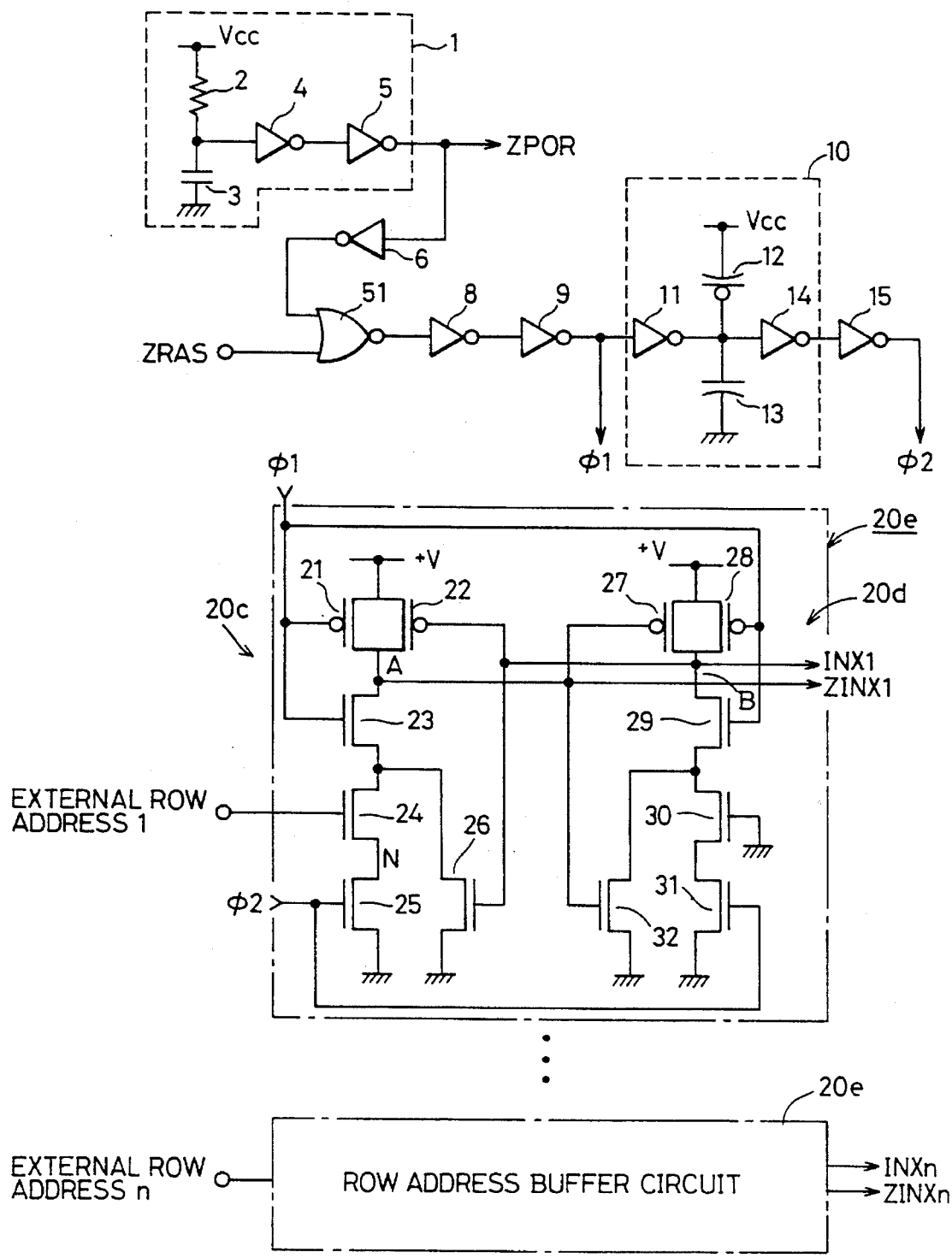
FIG. 1 is a circuit diagram of a row address buffer circuit according to an embodiment of the present invention.
Figure 7:
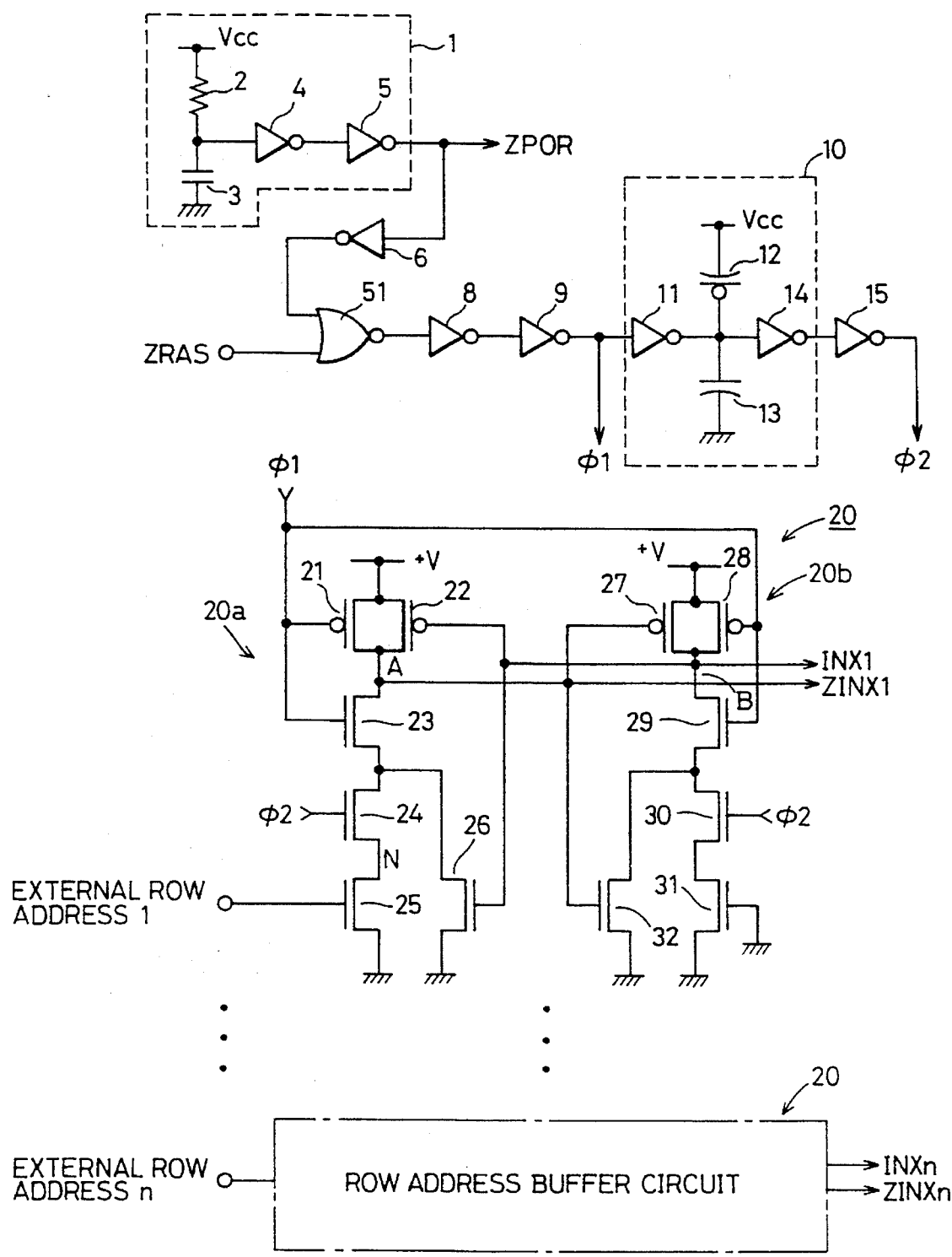
FIG. 7 is a circuit diagram of a conventional row address buffer circuit.
Figure 8:
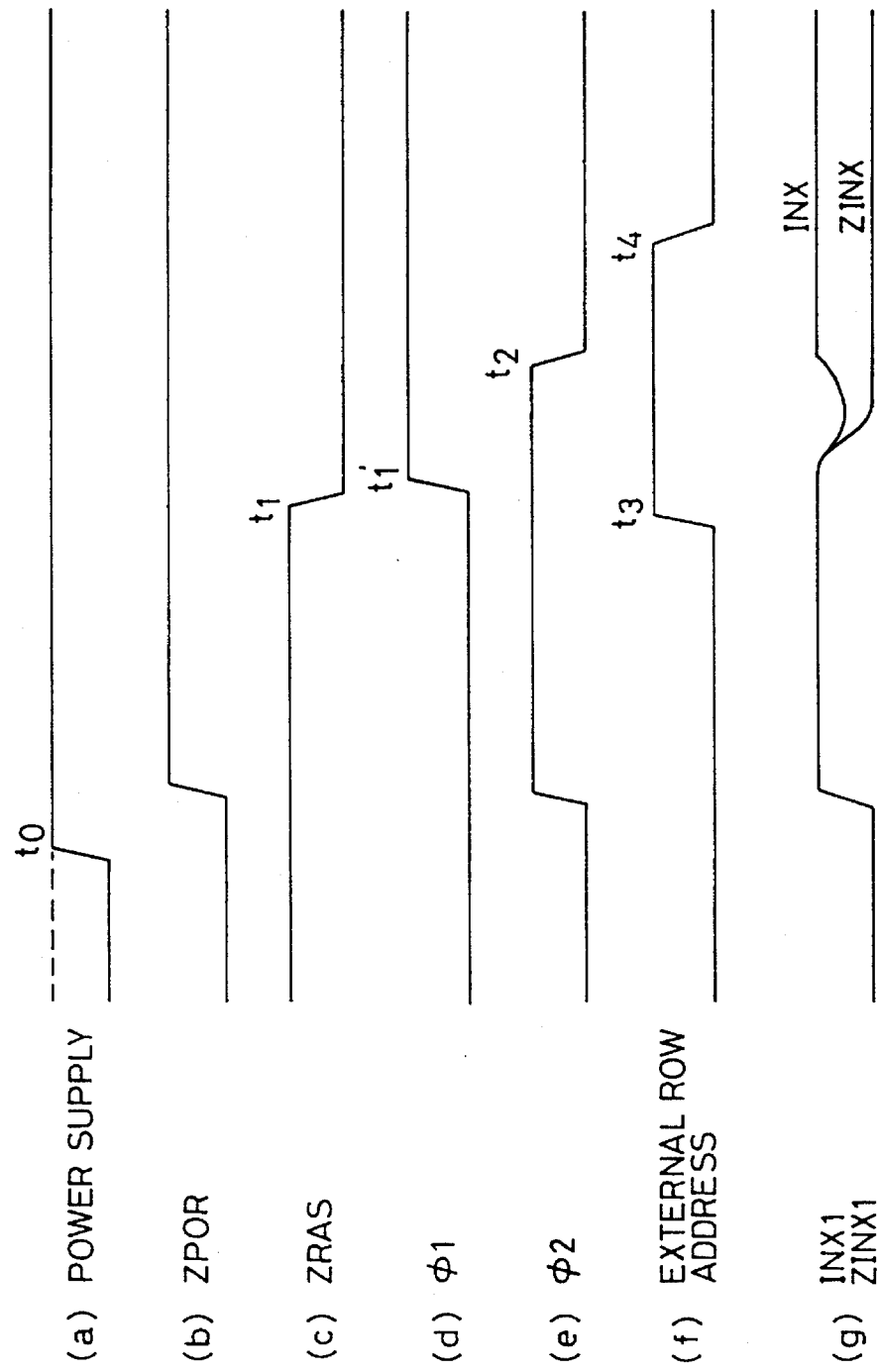
FIG. 8 is a timing chart of the row address buffer circuit of FIG. 6.

FIG. 1 is a circuit diagram of a row address buffer circuit according to an embodiment of the present invention. The present embodiment shown in FIG. 1 has a structure similar to that of FIG. 7, except that an external row address signal 1 is applied to the gate of an nMOS transistor 24 of one inverter 20c, a delayed activation signal φ2 is applied to the gate of an nMOS transistor 25, the gate of an nMOS transistor 30 of the other inverter 20d is grounded, and delayed activation signal φ2 is applied to the gate of an nMOS transistor 31.

Figure 2:
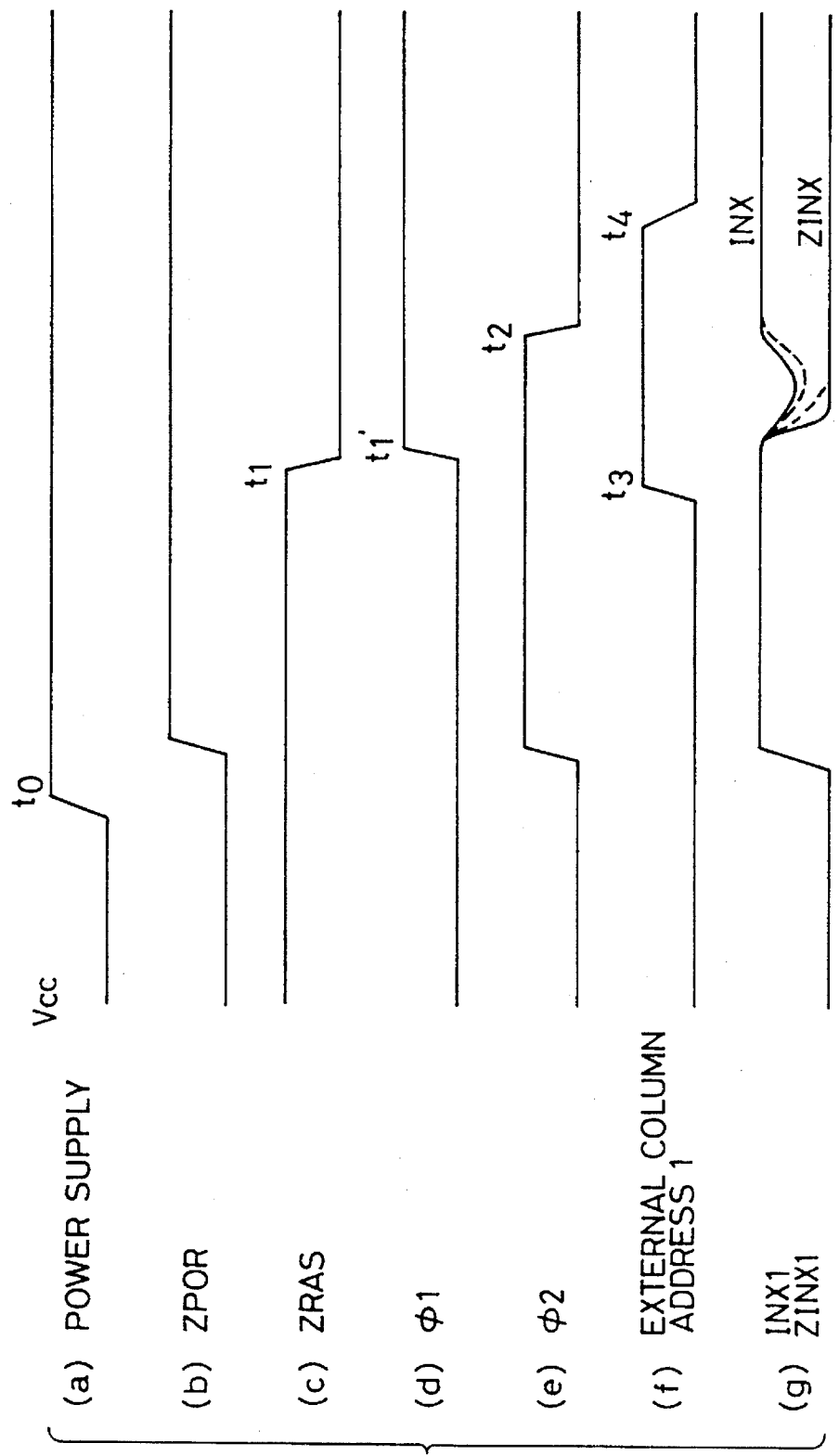
FIG. 2 is a timing chart for describing an operation of the column address buffer circuit of FIG. 1.

FIG. 2 is a timing chart for describing an operation of the row address buffer circuit of FIG. 1. When power is turned on, power supply reset signal generation circuit 1 causes ZPOR signal to be pulled up to a H level from a L level as shown in FIG. 2(a). When the power supply voltage becomes Vcc from 0 V at time t0, ZPOR signal attains a H level as shown in (b). This ZPOR signal of a H level is inverted by inverter 6 to be applied to one input of NOR gate 51. NOR gate 51 provides a signal according to the level of this ZRAS signal. When ZRAS signal attains a L level from a H level at time t1 shown in (c), activation signal φ1 attains a H level as shown in (d), and delayed activation signal φ2 attains a L level at time t2 determined by delay circuit 1, as shown in (e).

When an external column address signal 1 of a H level is applied during the time period of time t3 to time t4 as shown in (f), an internal row address signal of a L level is provided from row address buffer circuit 20e.

The specific operation of row address buffer circuit 20e will be described hereinafter. Because activation signal φ1 attains a L level when ZRAS signal attains a standby state of a H level, pMOS transistors 21 and 22 conduct, and nMOS transistor 23 is turned off. Therefore, nodes A and B are both precharged to a H level. During a standby time period, delayed activation signal φ2 attains a H level, and nMOS transistors 25 and 31 are turned on. When ZRAS signal attains a L level from a H level at time t1, activation signal φ1 attains a H level. PMOS transistors 21 and 28 precharging nodes A and B to a H level are turned off, and nMOS transistors 23 and 29 are turned on.

Here, the transistor size of pMOS transistors 22 and 27, nMOS transistors 23 and 29, and nMOS transistors 24 and 30, and 25 and 30 are selected to be equal to each other. Since an external row address signal 1 is applied at a TTL level with 2.0 V as a H level and 0.8 V as a L level, the stable threshold value of a H level and a L level is 1.4 V in a TTL level. The transistor size W1 of nMOS transistor 26 of inverters 20c and 20d is adjusted to have a difference from transistor size W2 of nMOS transistor 32 so that when nMOS transistors 23, 25, 29 and 31 are turned on by activation signal φ1 and delayed activation signal φ2 attaining a H level, node A attains a L level and node B attains a H level when external column address signal 1 becomes higher than the level of the threshold voltage of 1.4 V of a TTL, and node A attains a H level and node B attains a L level when external column address Signal 1 becomes lower than 1.4 V.

According to row address buffer circuit 20e of FIG. 1, nMOS transistor 25 to which activation signal φ2 is applied has its source connected to the ground potential side, and its drain side connected to nMOS transistor 24 of a gate voltage of a TTL level. Because the gate voltage of nMOS transistor 25 attains a H level of the power supply voltage of delayed activation signal φ2 to completely turn on nMOS transistor 25, the potential of node N becomes 0 V. When the substrate voltage of the nMOS transistor is 0 V, the back bias potential which is the difference between the source voltage and the substrate voltage becomes 0 V in both nMOS transistors 24 and 25. Therefore, the threshold voltage of nMOS transistors 24 and 25 will not be increased due to a body bias effect. Thus, the on resistance of series-connected nMOS transistors 24 and 25 can be made smaller than the conventional row address buffer circuit shown in FIG. 6. Node A precharged to a H level can be discharged to 0 V faster than the conventional case, and an internal address signal INX1 can be output faster.

Furthermore, the offset voltage of a latching circuit can be reduced at the time of amplification by forming a symmetrical latching circuit by connecting alternately the inputs and outputs of two inverters 20c and 20d in row address buffer circuit 20e, with symmetrical parasitic capacitance and resistance of each node. More specifically, although the size of pMOS transistors 21 and 28, 22 and 27, and nMOS transistors 23 and 29, 24 and 30, 25 and 31 are identical to each other and arranged in a symmetrical manner, the size of nMOS transistors 26 and 32 is set in an unbalanced manner. Because an external row address signal is a TTL level where the potential is 2.0 V in a H level and 0.8 V in a L level, the threshold voltage is (2.0 V+0.8 V)/2=1.4 V. The size of nMOS transistors 26 and 32 is determined so that internal address signal INX1 attains a H level, and ZINX1 attains a L level when external row address signal is greater than 1.4 V, and internal address signal INX1 attains a L level, and ZINX1 attains a H level when external row address signal 1 is lower than 1.4 V. Generally, the size of nMOS transistor 26 is set smaller than that of nMOS transistor 32.

According to the embodiment shown in FIG. 1, the time period starting from reception of an external row address signal up to the settlement of internal row address signals INX1 and ZINX1 can be reduced by precharging nodes A and B to the level of internal power supply potential Vcc. If an external row address signal of a H level is accepted when the latch settles at one level such as internal address signal INX="L" and ZINX="X", the time required for inverting the latch is lengthened to delay the time.

Figure 3:
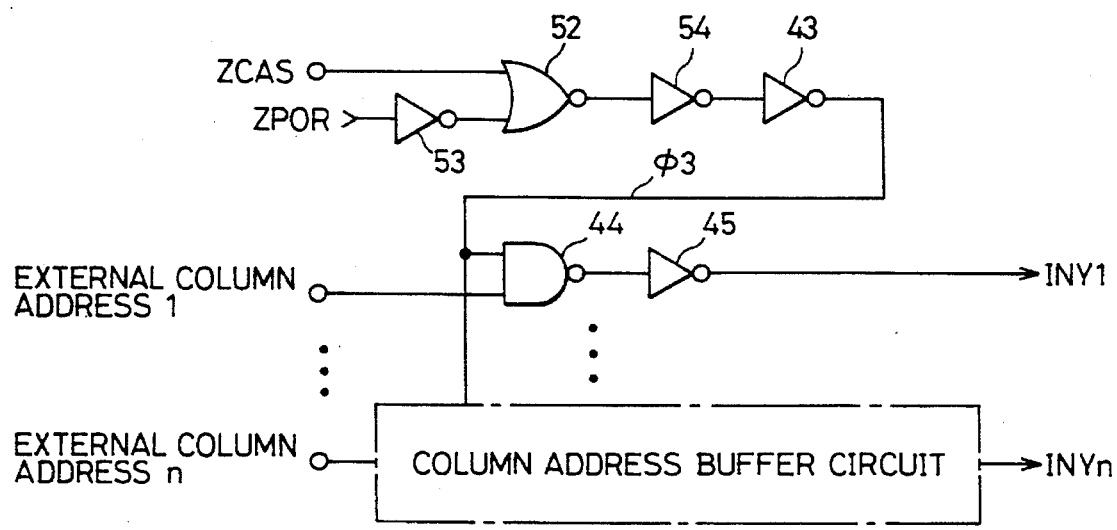
FIG. 3 is a circuit diagram of a column address buffer circuit according to another embodiment of the present invention.
Figure 9:
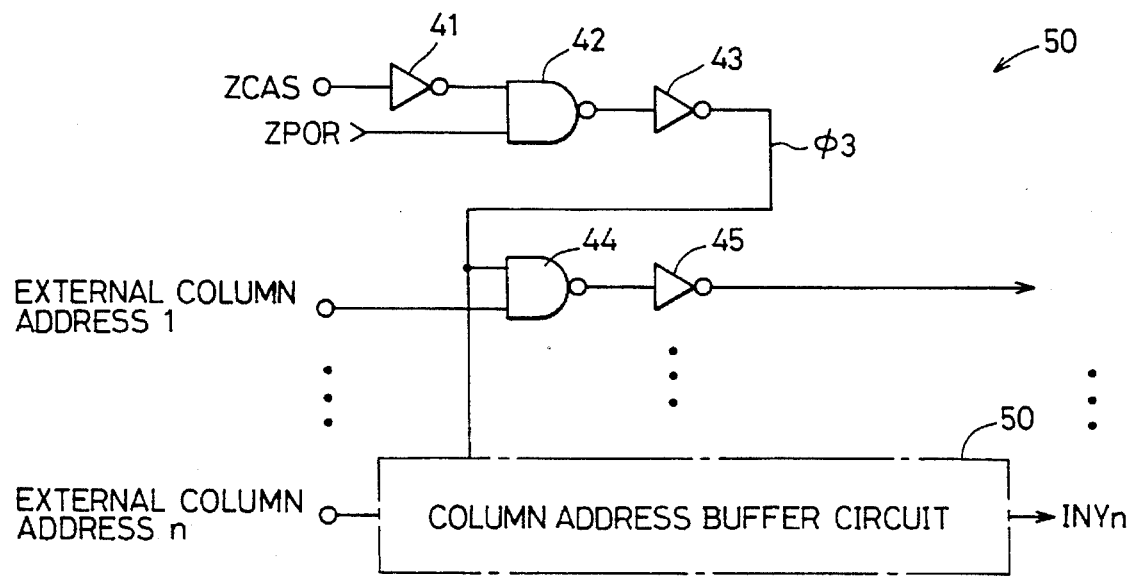
FIG. 9 is a circuit diagram of a conventional column address buffer circuit.
Figure 10:
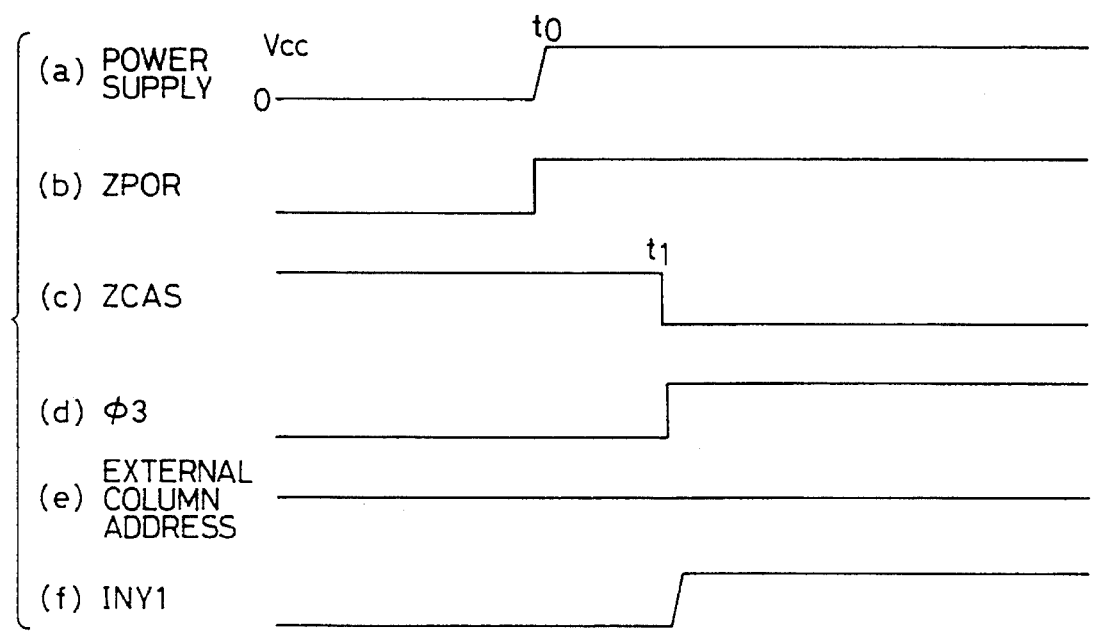
FIG. 10 is a timing chart for describing an operation of the column address buffer circuit of FIG. 8.

FIG. 3 is a circuit diagram of a column address buffer circuit according to another embodiment of the present invention. The column address buffer circuit of FIG. 3 has an NOR gate 52 provided instead of NAND gate 42 of FIG. 9. NOR gate 52 has a ZCAS signal applied to one input terminal, and a ZPOR signal inverted by an inverter 53 applied to the other input terminal. The output of NOR gate 52 is inverted by inverter 54 to be applied to inverter 43. The remaining structure is identical to that of FIG. 9.

Figure 4:
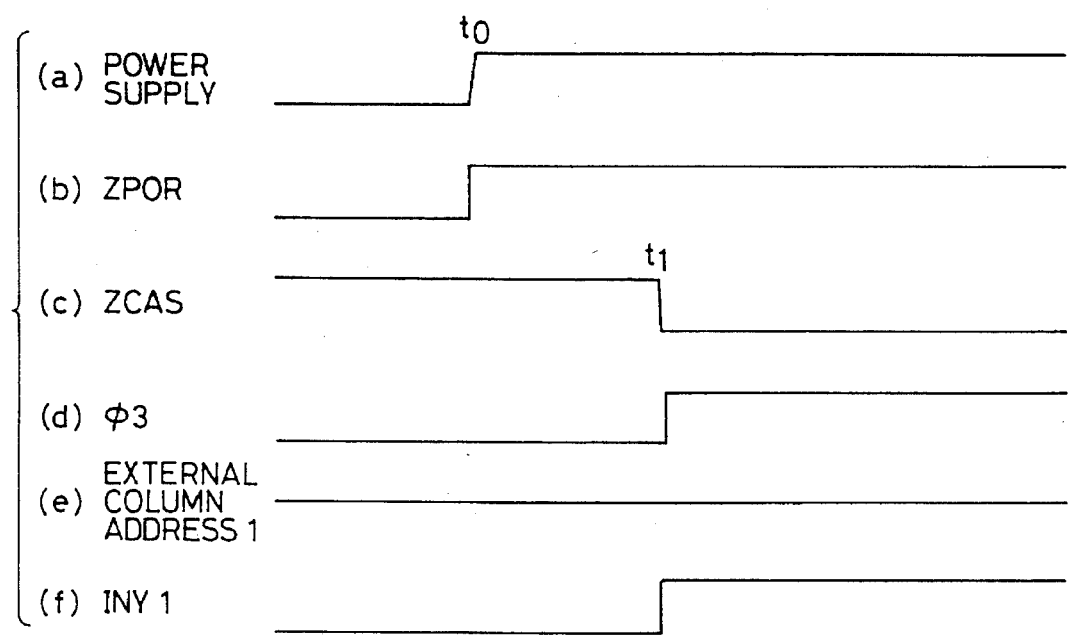
FIG. 4 is a timing chart for describing an operation of the column address buffer circuit of FIG. 3.

FIG. 4 is a timing chart for describing an operation of the column address buffer circuit of FIG. 3. When power is turned on at time t0 shown in (a), a ZPOR signal outputted from power supply reset signal generation circuit 1 is pulled up to a H level from a L level as shown in (b). Because ZPOR signal of a H level is inverted by inverter 53 and applied to the other input terminal of NOR gate 52, ZCAS signal can be accepted. When ZCAS signal attains a L level at time t1 as shown in (c), activation signal φ3 attains a H level as shown in (d). Therefore, NAND gate 44 provides an external column address signal 1 of a H level as shown in (e). External column address signal 1 is inverted by inverter 45, whereby internal column address signal INY1 attains a H level as shown in (f).

Figure 5:
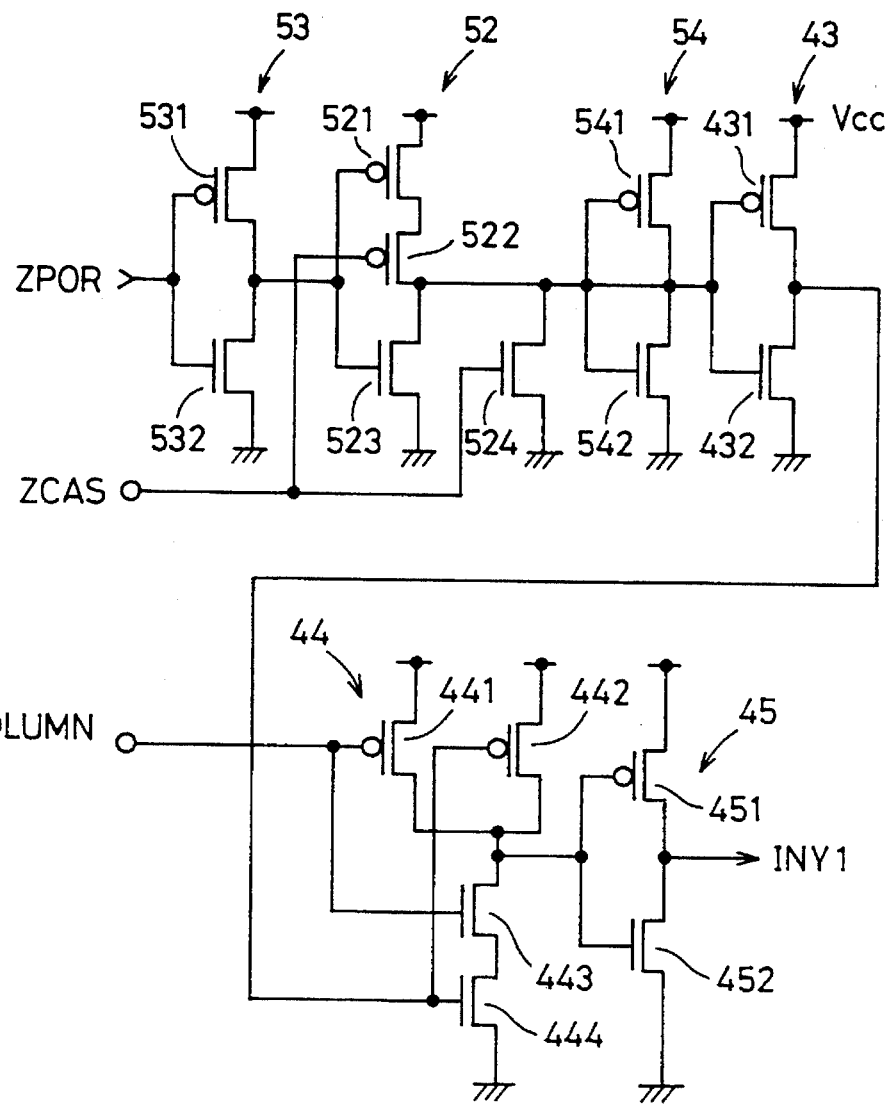
FIG. 5 is an electrical circuit diagram specifically showing the column address buffer of FIG. 3.

FIG. 5 is an electrical circuit diagram specifically showing the column address buffer of FIG. 3. Inverter 53 shown in FIG. 3 includes a pMOS transistor 531 and an nMOS transistor 532. ZPOR signal is applied to the gates of transistors 531 and 532. PMOS transistor 531 has its source supplied with power supply potential Vcc, and the drain connected to the drain of nMOS transistor 532. The source of nMOS transistor 532 is grounded. NOR gate 52 includes pMOS transistors 521 and 522, and nMOS transistors 523 and 524. ZCAS signal is applied to the gates of pMOS transistor 522 and nMOS transistor 524. pMOS transistor 521 and nMOS transistor 523 has each gate connected to the output of inverter 53. PMOS transistor 521 has its source supplied with power supply potential Vcc, and the drain connected to the source of pMOS transistor 522. The drain of pMOS transistor 522 is connected to the drains of nMOS transistors 523 and 524. The sources of nMOS transistors 523 and 524 are grounded, and connected to the input of inverter 54.

Inverter 54 includes a pMOS transistor 541 and an nMOS transistor 542. Each gate of pMOS transistor 541 and nMOS transistor 542 is connected to the output of NOR gate 52. PMOS transistor 541 has its source supplied with power supply potential Vcc, and its drain connected to the drain of nMOS transistor 542, and also to the input of inverter 43. The source of nMOS transistor 542 is grounded. Inverter 43 includes a pMOS transistor 431 and an nMOS transistor 432. The output of inverter 54 is connected to each gate of transistors 431 and 432. PMOS transistor 431 has its drain supplied with power supply potential, and its source connected to the drain of nMOS transistor 432 and one input terminal of NAND gate 44. The source of nMOS transistor 432 is grounded.

NAND gate 44 includes pMOS transistors 441 and 442, and nMOS transistors 443 and 444. An external column address signal 1 is applied to each gate of pMOS transistor 441 and nMOS transistor 443. The output of inverter 43 is connected to each gate of pMOS transistor 442 and nMOS transistor 444. PMOS transistors 441 and 442 have each source supplied with power supply potential Vcc, and each drain connected to the drain of nMOS transistor 443 and an input of inverter 45. The source of nMOS transistor 443 is connected to the drain of nMOS transistor 444. The source of nMOS transistor 444 is grounded. Inverter 45 includes a pMOS transistor 451 and an nMOS transistor 452. Each gate of pMOS transistor 451 and nMOS transistor 452 is connected to the output of NAND gate 44. PMOS transistor 451 has its source supplied with power supply potential Vcc, and its drain connected to the drain of nMOS transistor 452. An internal address signal INY1 is output from the node therebetween. The source of nMOS transistor 452 is grounded.

Referring to FIG. 5, prior to the power being turned on, ZPOR signal attains a L level, which does not change even if the power supply voltage has an insufficient level during its power being turned on. Therefore, a through current does not flow.

The usage of a NAND gate 44 for receiving external column address signal 1 provides the advantage of reducing the circuit area since a NOR gate occupies a greater area when the layout area of a NAND gate and a NOR gate of the same driving capability is compared. More specifically, the mobility p channel type electrons is approximately ½ the mobility of n channel type electrons and pMOS transistors 521 and 522 are connected in series in NOR gate 52, so that the size of a pMOS transistor is increased.

Figure 6:
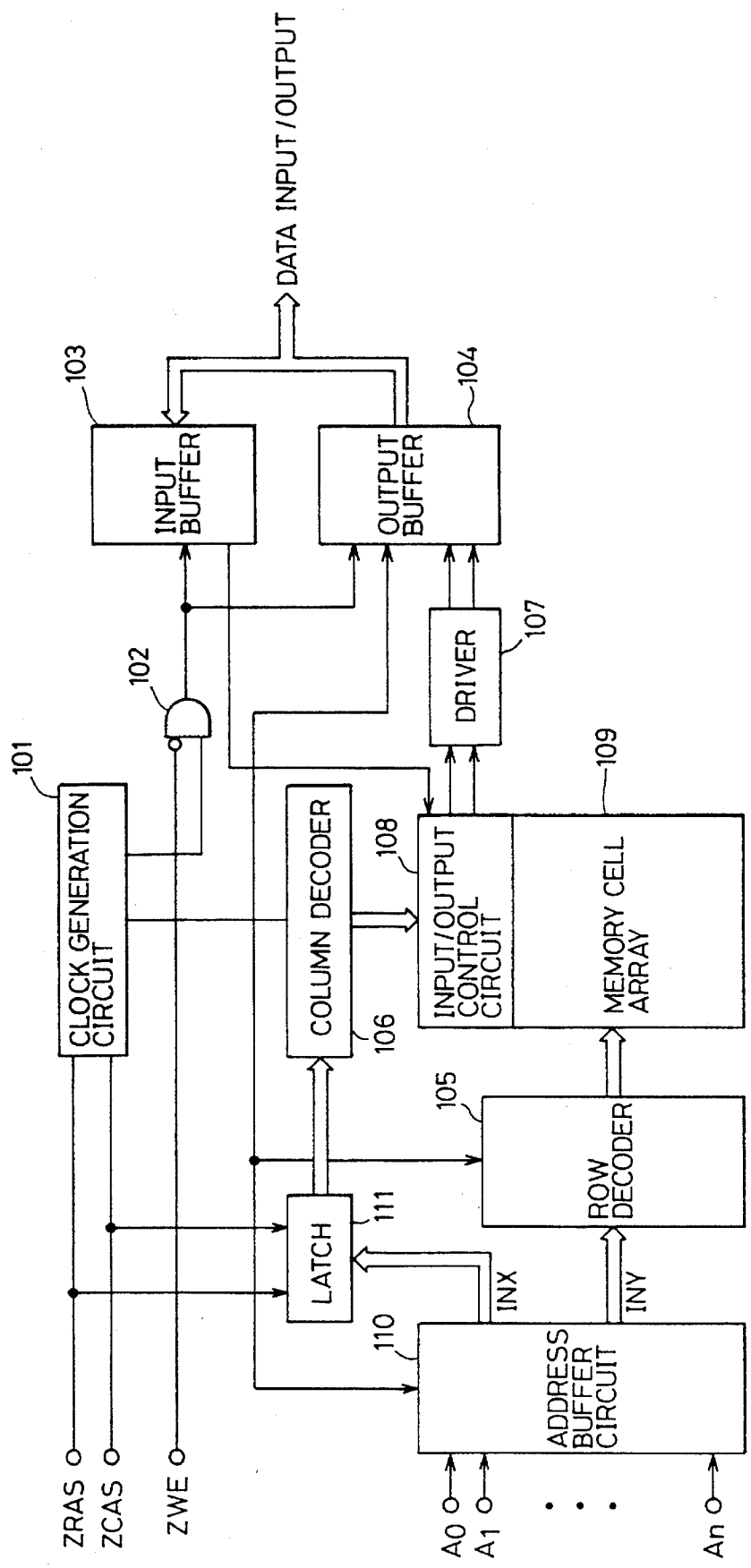
FIG. 6 is a block diagram showing a structure of a conventional DRAM.

Although the present invention is applied to a column address buffer for receiving an external column address in the above-described embodiments of FIGS. 3 and 5, a structure may be used where a write signal ZWE shown in FIG. 6 is received by the buffer shown in FIGS. 3 and 5.

According to the embodiments of the present invention, first and second nodes for providing an output signal are precharged by first and second precharge means, wherein first and second transistors are disconnected from first and second precharge means when a first activation signal attains a first logic level, and the first and second precharge means are disconnected from the first and second transistors when the first activation signal attains a second logic, whereby a signal is output from the first and second nodes according to a control signal applied to the first transistor. This reduces the time period starting from an input of an external control signal to settlement of the potential of first and second nodes.

In a column address buffer circuit, an external control signal is received by a CMOS inclusive OR gate, and data and an output of the inclusive OR gate are received by a CMOS logic product gate. Therefore, flow of a through current can be prevented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A buffer circuit formed of CMOS transistors for transferring an external signal into a semiconductor memory device, said buffer circuit comprising:

first and second nodes for providing an output signal, first precharging means for precharging said first node, second precharging means for precharging said second node, a first transistor to which said external signal is applied to an input electrode thereof, a second transistor having an input electrode thereof connected to a reference potential, a third transistor coupled to said first node and responsive to a first activation signal attaining a first logic level for disconnecting said first precharge means from a first electrode of said first transistor, and responsive to said first activation signal attaining a second logic level differing from said first logic level for connecting said first precharging means to the first electrode of said first transistor, and a fourth transistor coupled to said second node and responsive to said first activation signal attaining said first logic level for disconnecting said second precharge means from a first electrode of said second transistor, and responsive to said first activation signal attaining said second logic level for connecting said second precharge means to the first electrode of said second transistor.

2. The buffer circuit of a semiconductor memory device according to claim 1, further comprising:

a fifth transistor connected in parallel to said first precharge means, and having an input electrode thereof connected to said second node, and a sixth transistor connected in parallel to said second precharge means, and having an input electrode thereof connected to said first node.

3. The buffer circuit of a semiconductor memory device according to claim 2, further comprising:

a seventh transistor connected between said first transistor and said reference potential, responsive to a second activation signal attaining said first logic level for disconnecting said first transistor from said reference potential, and responsive to said second activation signal attaining said second logic level to connect said first transistor to said reference potential, and an eighth transistor connected between said second transistor and said reference potential, responsive to said second activation signal attaining said first logic level for disconnecting said second transistor from said reference potential, and responsive to said second activation signal attaining said second logic level for connecting said second transistor to said reference potential.

4. The buffer circuit of the semiconductor memory device according to claim 3, further comprising:

a ninth transistor connected in parallel to a series circuitry of said first transistor and said seventh transistor, and having an input electrode thereof connected to said second node, and a tenth transistor connected in parallel to the series circuitry of said second transistor and said eighth transistor, and having an input electrode connected to said first node.

5. The buffer circuit of a semiconductor memory device according to claim 1, further comprising:

power supply detection means for detecting power on, a gate element receiving an external control signal and an output of said power supply detection means for providing said first activation signal attaining a second logic level in response to detection of power on by said power supply detection means, and attaining a first logic level in response to said external control signal attaining a second logic level from a first logic level, and an inverter element outputting a second activation signal of a first logic level after said power is turned on, and said second activation signal of a second logic level after a predetermined time period from said external control signal attaining a second logic level from a first logic level.

6. A buffer circuit of a semiconductor memory device for transferring an external control signal that is active at a first logic level during a standby state into the semiconductor memory device, said buffer circuit comprising:

a CMOS inclusive OR gate for receiving said external control signal and an activation signal for activating said buffer circuit, and a CMOS logical product gate receiving data and an output of said CMOS inclusive OR gate during the standby state for providing said data to the semiconductor memory device in response to an output of said inclusive OR gate attaining a first logic level.

7. The buffer circuit of the semiconductor memory device according to claim 6, wherein a plurality of bits of said data are input in parallel, wherein said CMOS logic product gate comprises a plurality of CMOS logical product gates receiving respective data and output of said CMOS inclusive OR gate.

* * * * *